(12) United States Patent
Cheng et al.

(10) Patent No.: US 10,734,410 B2
(45) Date of Patent: Aug. 4, 2020

(54) CONDUCTIVE CONTACTS IN SEMICONDUCTOR ON INSULATOR SUBSTRATE

(71) Applicant: EPLIS TECHNOLOGIES INC., Ottawa (CA)

(72) Inventors: Kangguo Cheng, Schenectady, NY (US); Rama Divakaruni, Ossining, NY (US)

(73) Assignee: ELPIS TECHNOLOGIES INC., Ottawa, Ontario (CA)

(\*) Notice: Subject to any disclaimer, the term of this patent is extended or adjusted under 35 U.S.C. 154(b) by 118 days.

(21) Appl. No.: 15/477,277

(22) Filed: Apr. 3, 2017

(65) Prior Publication Data

US 2018/0076220 A1   Mar. 15, 2018

Related U.S. Application Data

(62) Division of application No. 15/260,441, filed on Sep. 9, 2016, now Pat. No. 9,685,535.

(51) Int. Cl.
*H01L 27/12* (2006.01)
*H01L 29/66* (2006.01)
(Continued)

(52) U.S. Cl.
CPC .... *H01L 27/1203* (2013.01); *H01L 21/30604* (2013.01); *H01L 21/31111* (2013.01); *H01L 21/324* (2013.01); *H01L 21/84* (2013.01); *H01L 23/5283* (2013.01); *H01L 29/0649* (2013.01); *H01L 29/0843* (2013.01); *H01L 29/0847* (2013.01); *H01L 29/6653* (2013.01); *H01L 29/6656* (2013.01); *H01L 29/66636* (2013.01); *H01L 29/7834* (2013.01); *H01L 29/7848* (2013.01)

(58) Field of Classification Search
CPC ...................... H01L 29/66636; H01L 27/1203
See application file for complete search history.

(56) References Cited

U.S. PATENT DOCUMENTS 6,841,831 B2    1/2005  Hanafi et al.
6,955,931 B1 \*  10/2005  Brown ..................... H01L 22/24
                                                 257/E21.438
(Continued)

FOREIGN PATENT DOCUMENTS

KR   20060069064 A   6/2006

OTHER PUBLICATIONS

Definition of "Over", http://www.dictionary.com (2017) (Year: 2017).\*
(Continued)

*Primary Examiner* — Michele Fan
(74) *Attorney, Agent, or Firm* — VanTek IP LLP; Shin Hung

(57) ABSTRACT

A semiconductor device includes a gate stack arranged on a channel region of a semiconductor layer and a semiconductor layer arranged on an insulator layer. A crystalline source/drain region is arranged in a cavity in the insulator layer, and a spacer is arranged adjacent to the gate stack, the spacer arranged over the source/drain region. A second insulator layer is arranged on the spacer and the gate stack, and a conductive contact is arranged in the source/drain region.

14 Claims, 19 Drawing Sheets

(51) Int. Cl.
*H01L 21/311* (2006.01)
*H01L 29/08* (2006.01)
*H01L 21/324* (2006.01)
*H01L 21/306* (2006.01)
*H01L 29/06* (2006.01)
*H01L 21/84* (2006.01)
*H01L 23/528* (2006.01)
*H01L 29/78* (2006.01)

(56) References Cited

U.S. PATENT DOCUMENTS

| | | | |
|---|---|---|---|
| 7,091,069 B2 | 8/2006 | Doris et al. | |
| 7,459,752 B2 | 12/2008 | Doris et al. | |
| 7,927,979 B2 | 4/2011 | Hill et al. | |
| 8,883,651 B2* | 11/2014 | Kim | H01L 21/26506 |
| | | | 438/739 |
| 9,105,636 B2 | 8/2015 | Liu | |
| 9,190,539 B2 | 11/2015 | Renna | |
| 9,685,535 B1 | 6/2017 | Cheng et al. | |
| 9,917,083 B2* | 3/2018 | Kura | H01L 27/088 |
| 2002/0034841 A1 | 3/2002 | Lee | |
| 2003/0102518 A1* | 6/2003 | Fried | H01L 21/84 |
| | | | 257/401 |
| 2003/0211681 A1 | 11/2003 | Hanafi et al. | |
| 2004/0188760 A1 | 9/2004 | Skotnicki et al. | |
| 2005/0082531 A1 | 4/2005 | Rim | |
| 2006/0084235 A1 | 4/2006 | Barr et al. | |
| 2006/0205169 A1* | 9/2006 | Yoon | H01L 29/6653 |
| | | | 438/303 |
| 2006/0237746 A1* | 10/2006 | Orlowski | H01L 29/165 |
| | | | 257/192 |
| 2007/0096148 A1* | 5/2007 | Hoentschel | H01L 21/84 |
| | | | 257/192 |
| 2007/0117334 A1* | 5/2007 | Nayfeh | H01L 29/458 |
| | | | 438/301 |
| 2007/0228482 A1* | 10/2007 | Wei | H01L 21/84 |
| | | | 257/369 |
| 2007/0235802 A1* | 10/2007 | Chong | H01L 21/823807 |
| | | | 257/346 |
| 2007/0235823 A1* | 10/2007 | Hsu | H01L 21/823807 |
| | | | 257/411 |
| 2007/0252204 A1* | 11/2007 | Wei | H01L 29/78684 |
| | | | 257/347 |
| 2007/0281446 A1 | 12/2007 | Winstead et al. | |
| 2008/0150024 A1* | 6/2008 | Surdeanu | H01L 21/26506 |
| | | | 257/347 |
| 2008/0157091 A1* | 7/2008 | Shin | H01L 29/6656 |
| | | | 257/66 |
| 2008/0169490 A1 | 7/2008 | Kawai | |
| 2008/0185617 A1* | 8/2008 | Kuan | H01L 29/6653 |
| | | | 257/288 |
| 2009/0145877 A1* | 6/2009 | Chang | H01L 21/31144 |
| | | | 216/13 |
| 2009/0224321 A1* | 9/2009 | Tsuchiya | H01L 21/823807 |
| | | | 257/351 |
| 2009/0236595 A1 | 9/2009 | Atanackovic | |
| 2010/0163994 A1 | 7/2010 | Kurz et al. | |
| 2010/0327358 A1 | 12/2010 | Kronholz et al. | |
| 2011/0024840 A1 | 2/2011 | Khater | |
| 2012/0056245 A1* | 3/2012 | Kang | H01L 21/0245 |
| | | | 257/192 |
| 2012/0329232 A1 | 12/2012 | Doris et al. | |
| 2013/0001555 A1* | 1/2013 | Yin | H01L 21/28518 |
| | | | 257/52 |
| 2013/0105898 A1* | 5/2013 | Wang | H01L 21/84 |
| | | | 257/352 |
| 2013/0161650 A1* | 6/2013 | Lai | H01L 21/3247 |
| | | | 257/77 |
| 2013/0328215 A1 | 12/2013 | Lai et al. | |
| 2014/0151759 A1* | 6/2014 | Loubet | H01L 29/06 |
| | | | 257/288 |
| 2014/0159124 A1 | 6/2014 | Doris et al. | |
| 2015/0263137 A1* | 9/2015 | Chen | H01L 29/401 |
| | | | 438/283 |
| 2016/0020301 A1* | 1/2016 | Park | H01L 29/66636 |
| | | | 257/283 |
| 2016/0141243 A1* | 5/2016 | You | H01L 23/5226 |
| | | | 257/369 |
| 2016/0314969 A1* | 10/2016 | Lin | H01L 21/283 |
| 2017/0110554 A1* | 4/2017 | Tak | H01L 29/4991 |

OTHER PUBLICATIONS

List of IBM Patents or Patent Applications Treated As Related; (Appendix P), Filed Mar. 14, 2019, 2 pages.

List of IBM Patents or Patent Applications Treated As Related; (Appendix P), Filed Jan. 31, 2019, 2 pages.

Kangguo Cheng et al. "Conductive Contacts in Semiconductor on Insulator Substrate", U.S. Appl. No. 16/661,539, filed Oct. 23, 2019.

List of IBM Patents or Patent Applications Treated as Related; (Appendix P), filed Oct. 23, 2019; 2 pages.

* cited by examiner

US 10,734,410 B2

CONDUCTIVE CONTACTS IN SEMICONDUCTOR ON INSULATOR SUBSTRATE

This application is a Divisional of Non-Provisional application Ser. No. 15/260,441, entitled "CONDUCTIVE CONTACTS IN SEMICONDUCTOR ON INSULATOR SUBSTRATE," filed Sep. 9, 2016 which is incorporated herein by reference in its entirety.

BACKGROUND

The present invention generally relates to complimentary metal-oxide semiconductors (CMOS) and metal-oxide-semiconductor field-effect transistors (MOSFET), and more specifically, to conductive contacts.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device includes forming a gate sack on a semiconductor layer, depositing a first layer of spacer material over the gate stack and exposed portions of the semiconductor layer, depositing a second spacer layer over the first layer of spacer material, and removing portions of the second spacer layer to expose portions of the layer of spacer material. Portions of the layer of spacer material are formed to form a spacer adjacent to the gate stack such that a portion of the second spacer layer is arranged on a region of the spacer. An exposed portion of the semiconductor layer is removed to expose portions of an insulator layer. Portions of the insulator layer are removed to form a cavity beneath the semiconductor layer and the spacer. A source/drain region are grown from exposed portions of the semiconductor layer to fill the cavity with the source/drain region. An insulator layer is deposited on the source/drain region and the gate stack. Portions of the insulator layer are removed to form a second cavity that exposes portions of the spacer and the source/drain region, and portions of the source/drain region are removed in the second cavity. A conductive material is deposited in the second cavity.

According to another embodiment of the present invention, a method for forming a semiconductor device includes forming a gate sack on a semiconductor layer, depositing a layer of spacer material over the gate stack and exposed portions of the semiconductor layer, depositing a second spacer layer over the layer of spacer material, and removing portions of the second spacer layer to expose portions of the layer of spacer material. Portions of the layer of spacer material are removed to form a spacer adjacent to the gate stack such that a portion of the second spacer layer is arranged on a region of the spacer, and an exposed portion of the semiconductor layer is removed to expose portions of an insulator layer. Portions of the insulator layer are removed to form a cavity beneath the semiconductor layer and the spacer. A source/drain region is grown from exposed portions of the semiconductor layer to fill the cavity with the source/drain region. An insulator layer is deposited on the source/drain region and the gate stack. Portions of the insulator layer are removed to form a second cavity that exposes portions of the spacer and the source/drain region. Portions of the source/drain region are removed in the second cavity using an isotropic etching process, and a conductive material is deposited in the second cavity.

According to yet another embodiment of the present invention, a semiconductor device includes a gate stack arranged on a channel region of a semiconductor layer and a semiconductor layer arranged on an insulator layer. A crystalline source/drain region is arranged in a cavity in the insulator layer, and a spacer is arranged adjacent to the gate stack, the spacer arranged over the source/drain region. A second insulator layer is arranged on the spacer and the gate stack, and a conductive contact is arranged in the source/drain region.

BRIEF DESCRIPTION OF THE DRAWINGS

FIG. 17 illustrates a cut-away view of an alternate exemplary embodiment. In this regard, following the formation of the cavity (described above in FIG. 14) a selective isotropic etching process is performed to remove exposed portions of the source/drain region and the doped semiconductor regions to form a cavity.

FIG. 18 illustrates a cut-away view following the formation of conductive contact in the cavity (of FIG. 17).

DETAILED DESCRIPTION

The formation of raised source/drain regions on a semiconductor-on-insulator (SOI) substrate often causes undesirable parasitic capacitance in MOSFET devices. Further, as pitch scaling continues to decrease, the available surface area for forming low resistance contacts to the source/drain regions of MOSFET devices becomes more limited.

The illustrated exemplary embodiments described herein provide for forming conductive contacts in a buried oxide or insulator layer of a SOI substrate that have increased surface area for reducing the resistance in the contacts.

Figure 1:
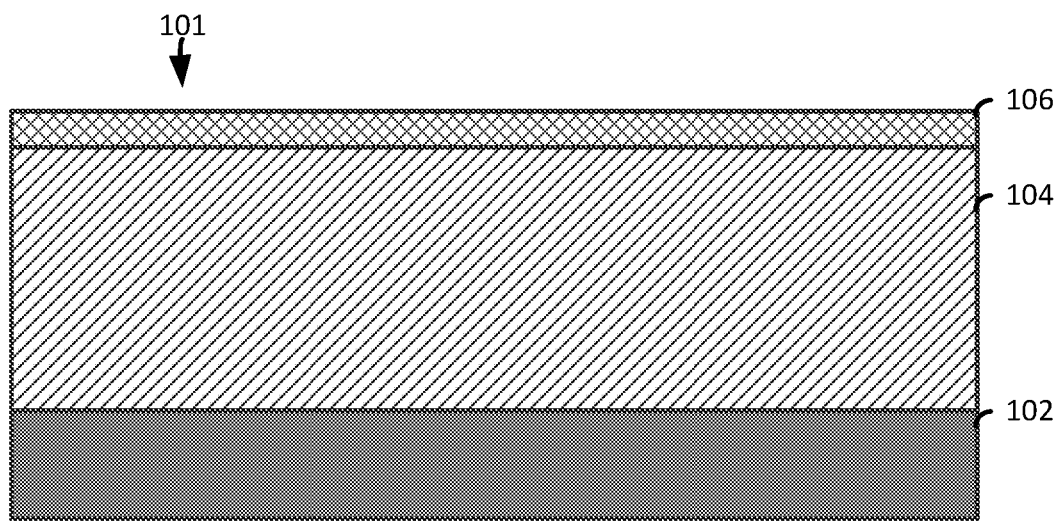
FIG. 1 illustrates a side view of a semiconductor-on-insulator (SOI) wafer.

FIG. 1 illustrates a side view of a semiconductor-on-insulator (SOI) wafer 101. The SOI wafer 101 includes an insulator layer 104 arranged on a semiconductor substrate 102, and a semiconductor layer 102 arranged on the insulator layer 104. The SOI wafer 101 can be formed by any suitable technique such as, for example wafer bonding, Smartcut™, SIMOX (Separation by IMplanted Oxygen).

The semiconductor substrate 102 can include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate can also comprise an organic semiconductor or a layered semiconductor such as, for example, Si/SiGe, a silicon-on-insulator or a SiGe-on-insulator. A portion or entire semiconductor substrate can be amorphous, polycrystalline, or monocrystalline. In addition to the aforementioned types of semiconductor substrates, the semiconductor substrate employed in the present invention can also comprise a hybrid oriented (HOT) semiconductor substrate in which the HOT substrate has surface regions of different crystallographic orientation. The semiconductor substrate can be doped, undoped or contain doped regions and undoped regions therein. The semiconductor substrate can contain regions with strain and regions without strain therein, or contain regions of tensile strain and compressive strain.

The insulator layer 104 can include, for example, a buried oxide (BOX) material or other suitable insulator materials. Examples of suitable insulator materials include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum.

The thickness of insulator layer 104 generally varies and is not intended to be limited. In one aspect, the thickness of the insulator layer 104 is in a range from about 10 nm to about 1000 nm. The insulator layer 104 can be formed by any suitable process such as thermal oxidation, thermal nitridation, chemical vapor deposition (CVD).

The semiconductor layer 106 of the illustrated embodiment can have the same material as the semiconductor substrate 102 or a different material from the semiconductor substrate 102. The semiconductor layer 106 may include, for example, silicon, germanium, silicon germanium, silicon carbide, and those consisting essentially of III-V compound semiconductors. In some embodiments, the semiconductor layer 106 can have a single semiconductor material. In some embodiments, the semiconductor layer 106 can have different semiconductor materials in different regions. In some embodiments, a portion or the entire semiconductor layer 106 is strained. In some embodiments, different regions of the semiconductor layer 106 can have different strains. In some embodiments, some regions of the semiconductor layer 106 are relaxed (no strain) and other regions of the semiconductor layer 106 are strained. In some embodiments, some regions of the semiconductor layer 106 have tensile strain and other regions of the semiconductor layer 106 have compressive strain. The thickness of the semiconductor layer ranges from 3 nm to 15 nm, although thickness less than 3 nm or greater than 15 nm may also be used in alternate embodiments.

Figure 2:
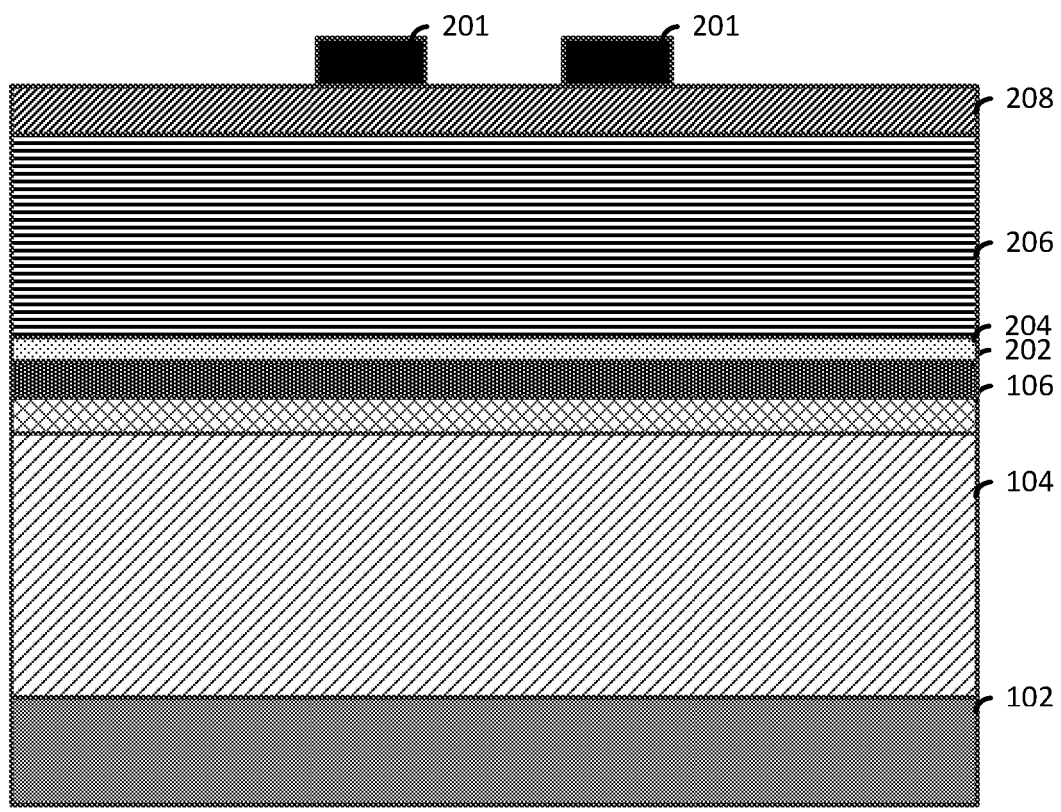
FIG. 2 illustrates a side view following the deposition of layers of gate stack materials on the wafer.

FIG. 2 illustrates a side view following the deposition of layers of gate stack materials. In the illustrated exemplary embodiment, high-k metal gate materials are used however; alternate embodiments can include any type of suitable gate stack materials. The layers of gate stack materials include a gate dielectric layer 202 arranged on the semiconductor layer 106. A work function metal(s) layer 204 arranged on the gate dielectric layer 202. A metal gate conductor layer(s) 206 is arranged on work function metal layer 204, and a gate cap layer 208 is arranged on the metal gate conductor layer(s) 206.

The gate dielectric 202 material(s) can be a dielectric material having a dielectric constant greater than 3.9, 7.0, or 10.0. Non-limiting examples of suitable materials for the dielectric 202 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 202 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 204 can be disposed over the gate dielectric 202 material. The type of work function metal(s) 204 depends on the type of transistor and can differ between the nFET and pFET devices. Non-limiting examples of suitable work function metals 204 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 206 material(s) is deposited over the gate dielectric 202 materials and work function metal(s) 204. Non-limiting examples of suitable conductive metals include aluminum (Al), platinum (Pt), gold (Au), tungsten (W), titanium (Ti), or any combination thereof. The gate conductor 206 material(s) can be deposited by a suitable deposition process, for example, CVD, PECVD, PVD, plating, thermal or e-beam evaporation, and sputtering.

A gate cap layer 208 can be deposited on the gate stack. A masking layer 201 can be used to pattern the gate cap layer and gate stack. The masking layer 201 can be a resist or a hardmask. Suitable resist masks include photoresists, electron-beam resists, ion-beam resists, X-ray resists, and etch resists. The resist can a polymeric spin on material or a polymeric material. Suitable hardmask include silicon oxide, silicon nitride, silicon oxynitride, SiCO or any other suitable materials. The masking layer can be formed by lithography or other suitable patterning techniques such as sidewall image transfer.

Figure 3A:
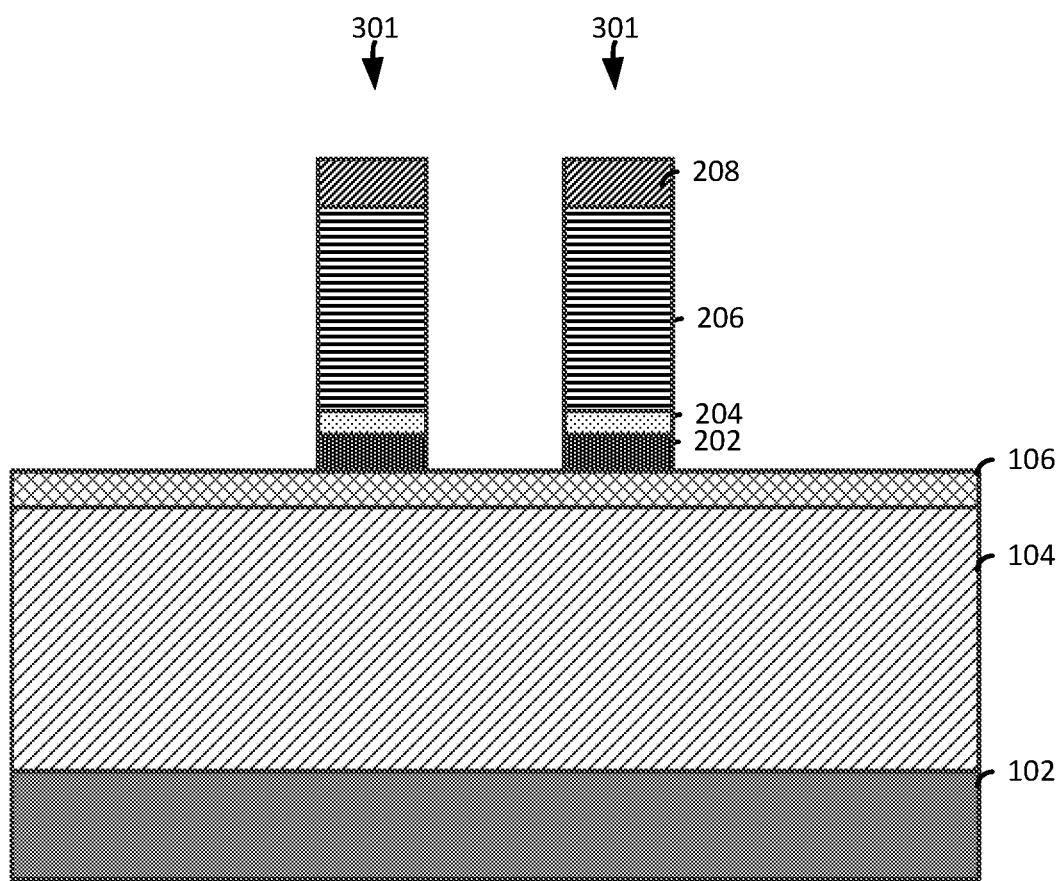
FIG. 3A illustrates a cut-away view along the line A-A (of FIG. 3B) following the patterning of the gate stacks.
Figure 3B:
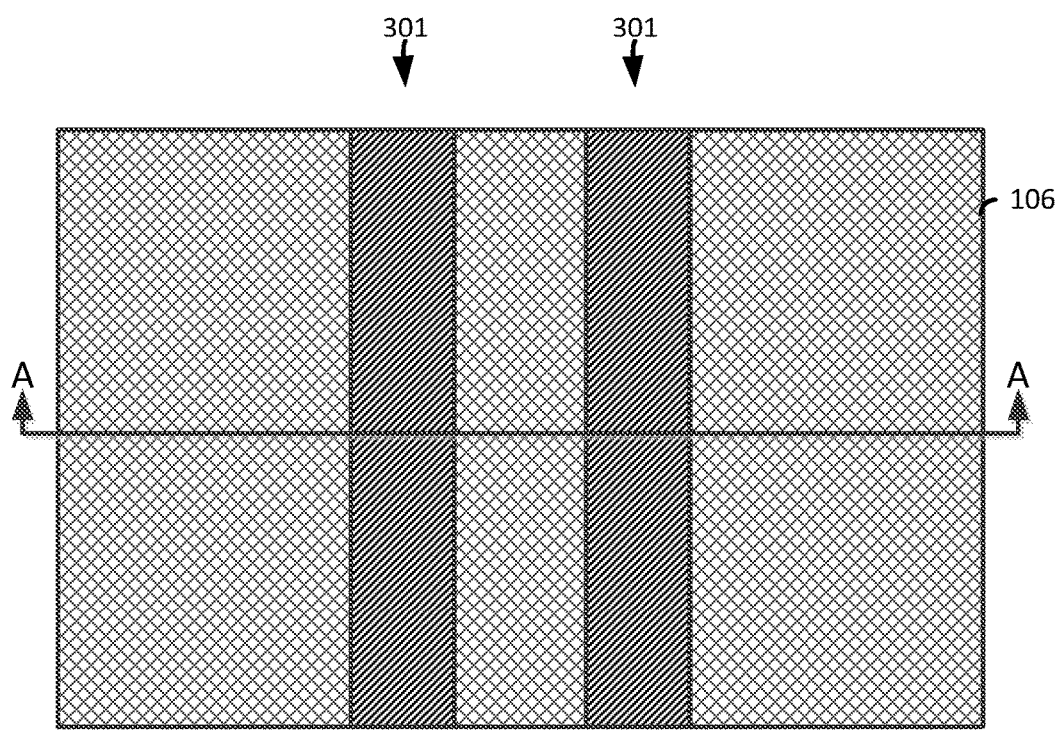
FIG. 3B illustrates a top view following the formation of the gate stacks.

FIG. 3A illustrates a cut-away view along the line A-A (of FIG. 3B) following the patterning of the gate stacks 301. The gate stacks 301 are formed by performing an etching process such as, for example, reactive ion etching that removes exposed portions of the layers of gate stack materials to expose portions of the semiconductor layer 106. Following the formation of the gate stacks 301 the masking layer 201 (of FIG. 2) can be removed by, for example, ashing to remove resist. The ashing process can be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof. FIG. 3B illustrates a top view following the formation of the gate stacks 301.

Figure 4:
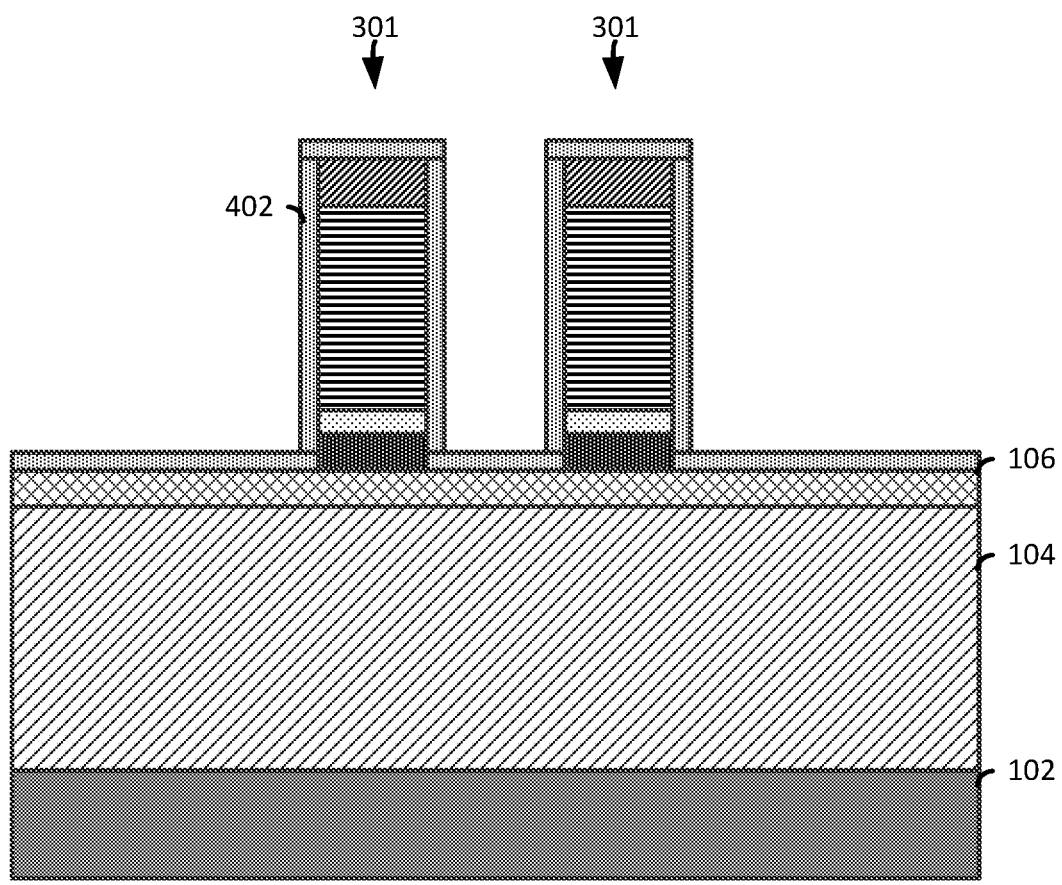
FIG. 4 illustrates a cut-away view following the formation of a layer of spacer material over the gate stacks and exposed portions of the semiconductor layer.

FIG. 4 illustrates a cut-away view following the formation of a layer of spacer material 402 over the gate stacks 301 and exposed portions of the semiconductor layer 106. Non-limiting examples of suitable materials for the layer of spacer material 402 include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Figure 5:
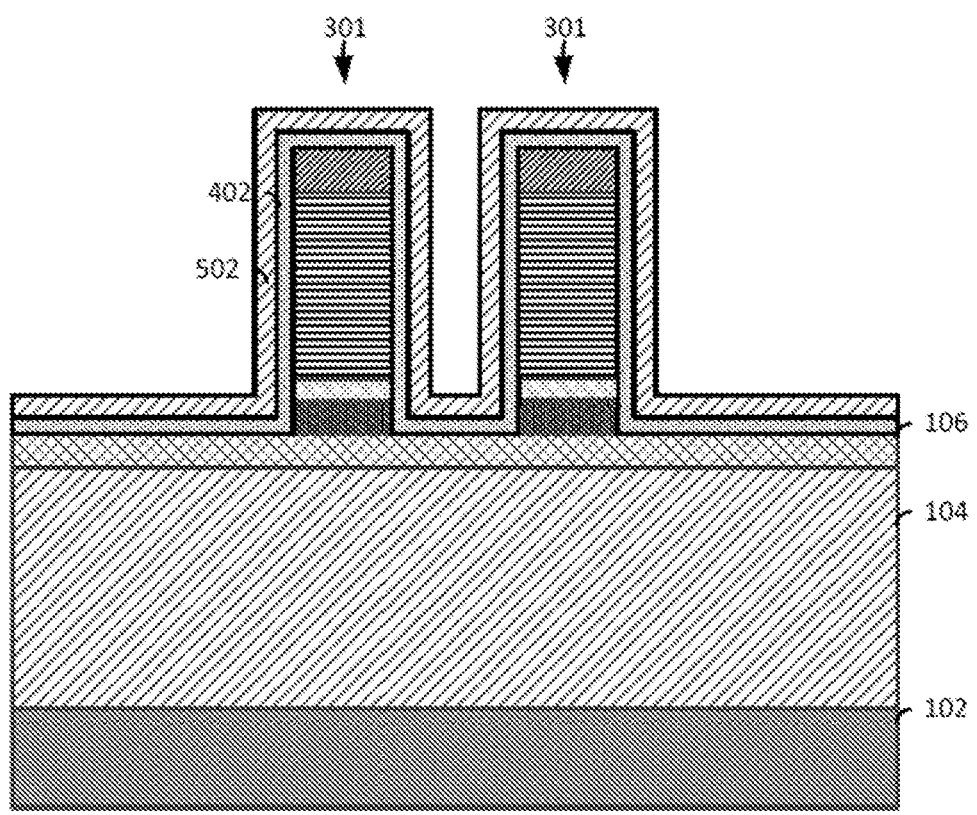
FIG. 5 illustrates a cut-away view following the formation of a second spacer layer over the layer of spacer material.

FIG. 5 illustrates a cut-away view following the formation of a second spacer 502 that can include, for example an oxide or other spacer material over the layer of spacer material 402. Non-limiting examples of the second spacer include silicon dioxide, SiOC. Non-limiting examples of processes for forming the second spacer include CVD or ALD.

Figure 6:
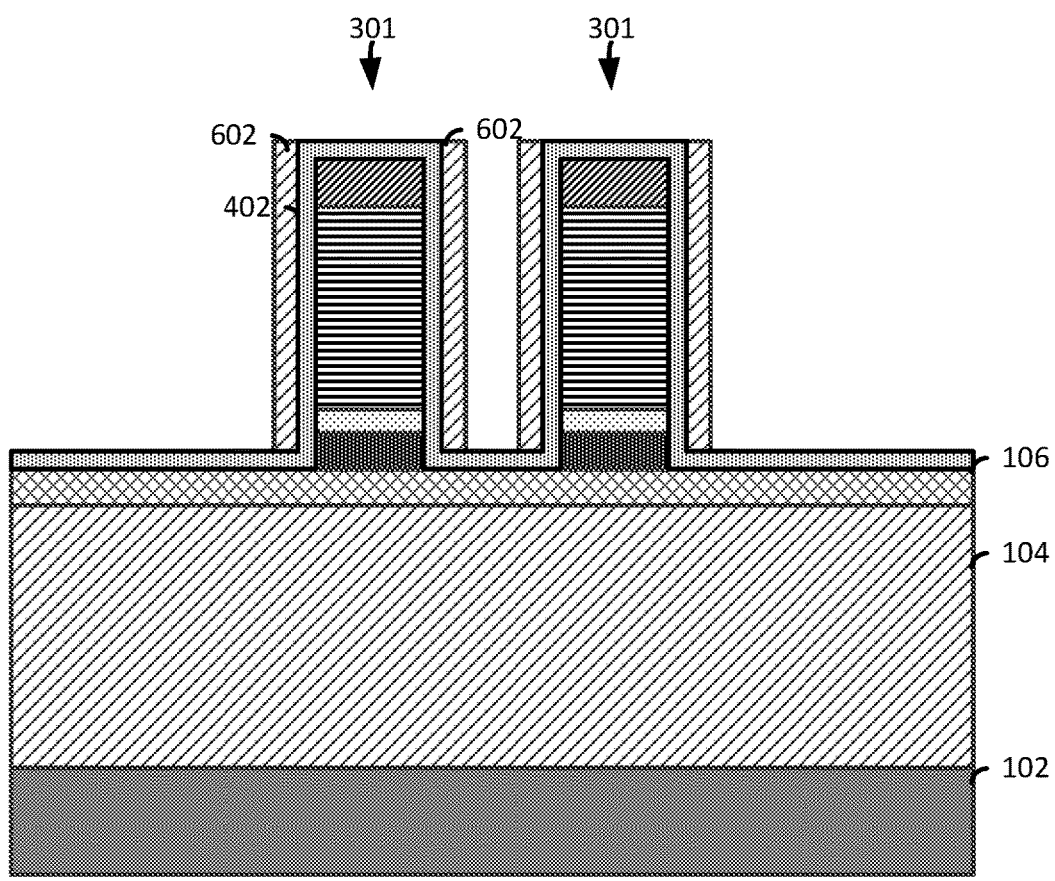
FIG. 6 illustrates a cut-away view following a selective anisotropic etching process that removes exposed portions of the second spacer layer (of FIG. 5) to form a first set of spacers.

FIG. 6 illustrates a cut-away view following a selective anisotropic etching process that removes exposed portions of the second spacer layer 502 (of FIG. 5) to form a first set of spacers 602. The etching process can include for example, reactive ion etching that removes portions of the second spacer layer 502 to expose portions of the layer of spacer material 402 and form the spacers 602.

Figure 7:
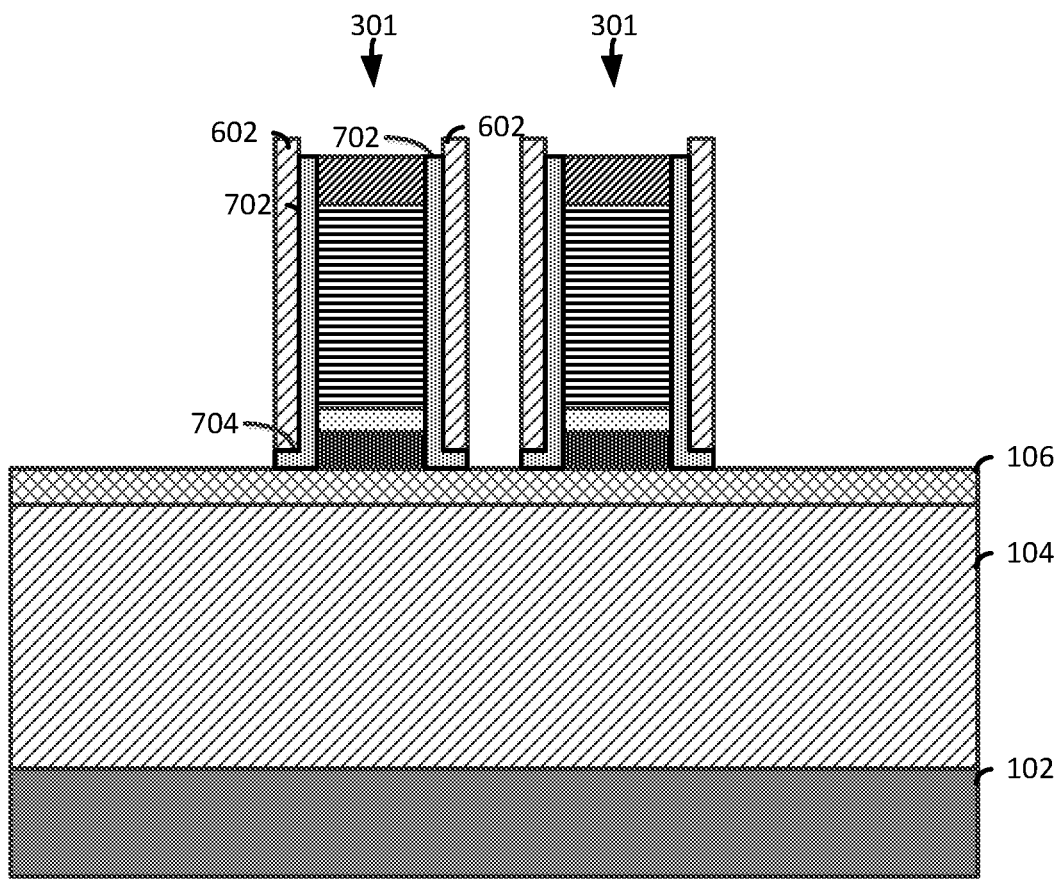
FIG. 7 illustrates a cut-away view following a selective anisotropic etching process that removes exposed portions of the layer of spacer material (of FIG. 6) to form a second set of spacers adjacent to the gate stack.

FIG. 7 illustrates a cut-away view following a selective anisotropic etching process that removes exposed portions of the layer of spacer material 402 (of FIG. 6) to form a second set of spacers 702 adjacent to the gate stack 301. The first set of spacers 602 are arranged on a region 704 of the second set of spacers 702.

Figure 8:
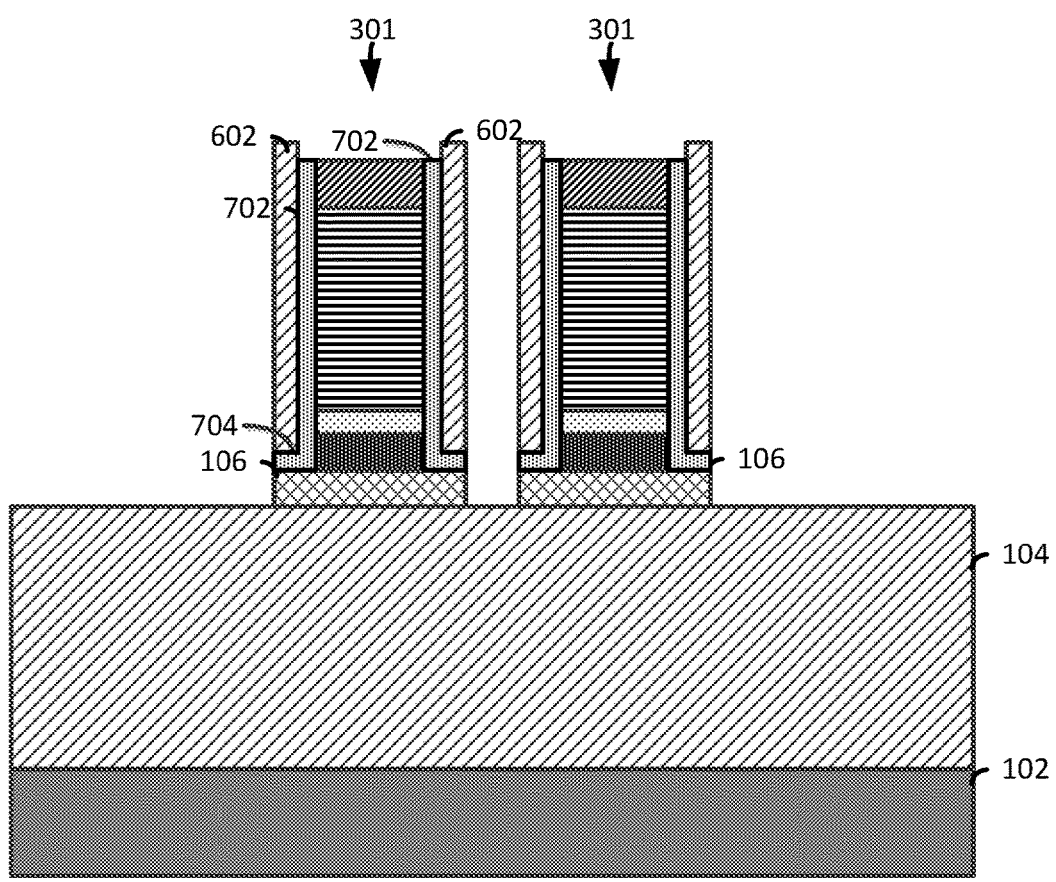
FIG. 8 illustrates a cut-away view following a selective anisotropic etching process that removes exposed portions of the semiconductor layer and exposes portions of the insulator layer.

FIG. 8 illustrates a cut-away view following a selective anisotropic etching process that removes exposed portions of the semiconductor layer 106 and exposes portions of the insulator layer 104. The anisotropic etching process can include, for example, a reactive ion etching process.

Figure 9:
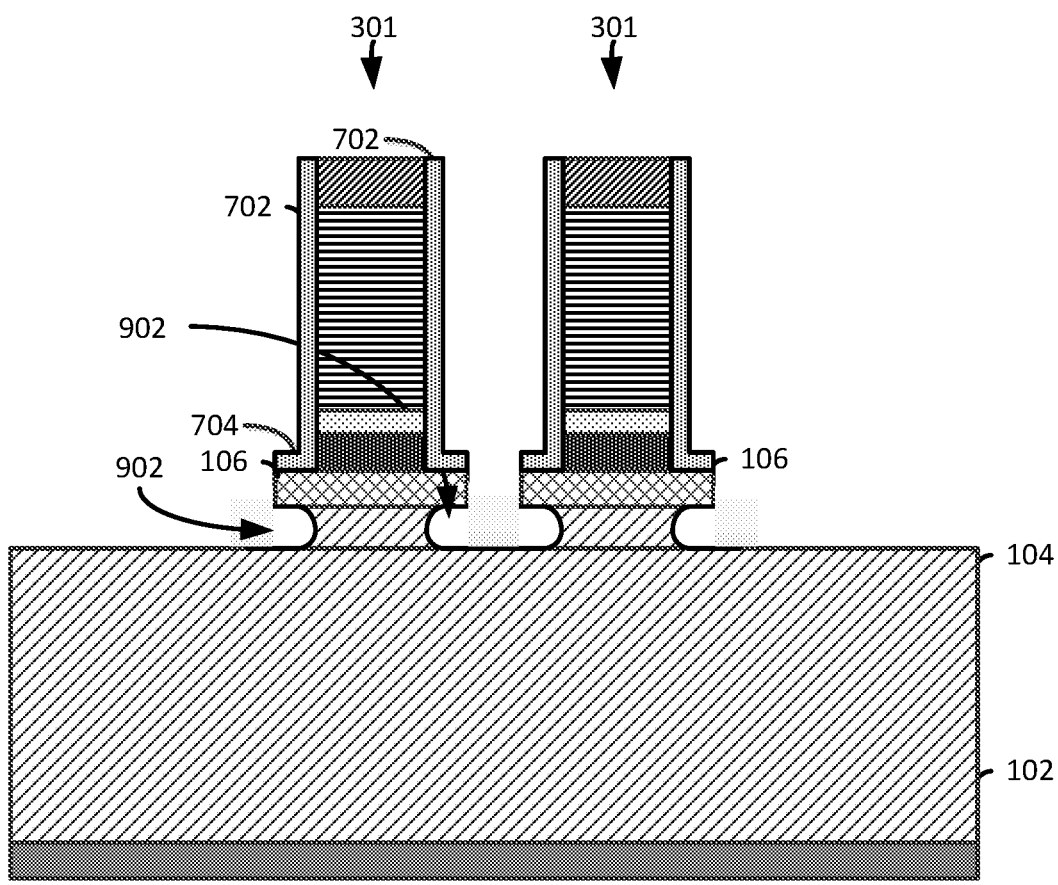
FIG. 9 illustrates a cut-away view following a selective isotropic etching process that removes exposed portions of the insulator layer and forms undercut regions.

FIG. 9 illustrates a cut-away view following a selective etching process that removes exposed portions of the insulator layer 104 and forms undercut regions (cavities) 902. In some embodiment, the process for forming the undercut regions is an isotropic etch process. The undercut regions 902 are defined by the insulator layer 104 and the semiconductor layer 106. Suitable isotropic etching processes include, for example, a wet etching process. For example, an aqueous solution containing hydrofluoric acid is suitable to etch the oxide insulator layer 104. In some embodiment, during the isotropic etching process the first set of spacers 602 can be removed. Alternatively, the spacers 602 can be removed before or after forming the undercut regions.

Figure 10:
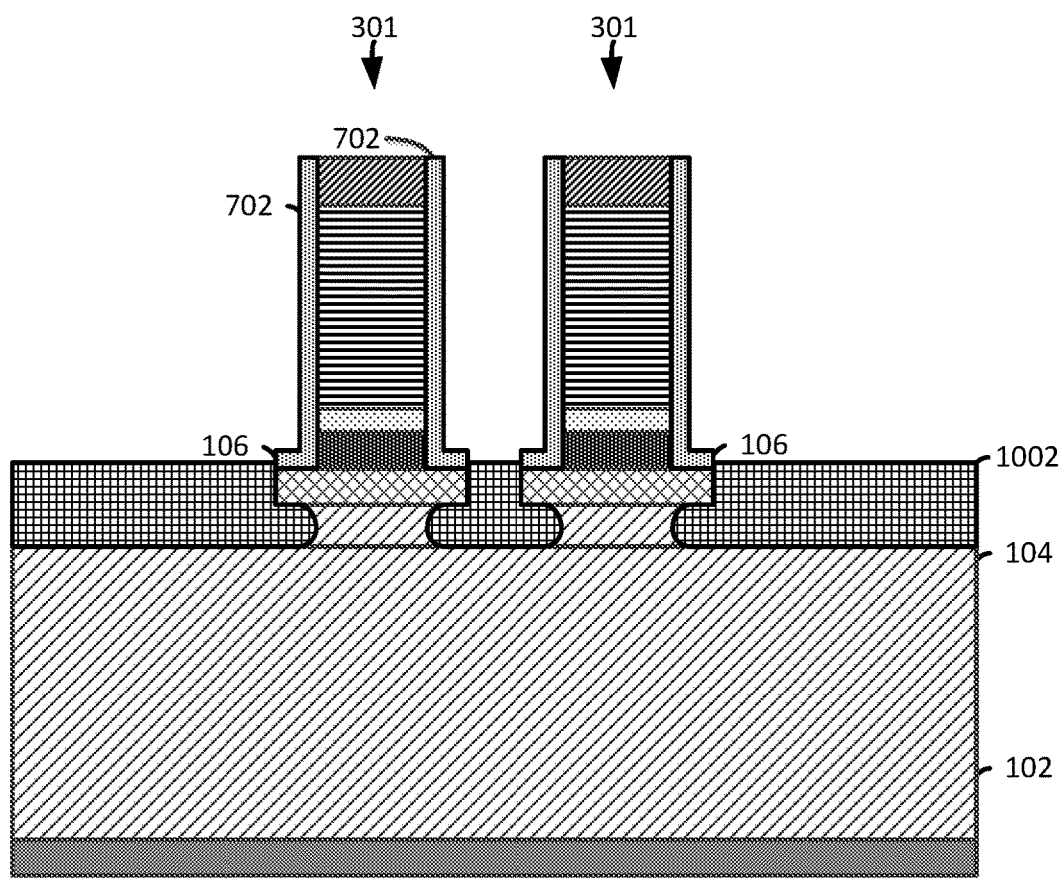
FIG. 10 illustrates a cut-away view following an epitaxial growth process that forms source/drain regions in the undercut regions.

FIG. 10 illustrates a cut-away view following an epitaxial growth process that forms source/drain regions 1002 in the undercut regions 902. The source/drain regions 1002 are formed by an epitaxial growth process that deposits a crystalline overlayer of semiconductor material onto the exposed crystalline seed material of the exposed semiconductor layer 106 to form the source/drain regions 1002.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ to $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 11:
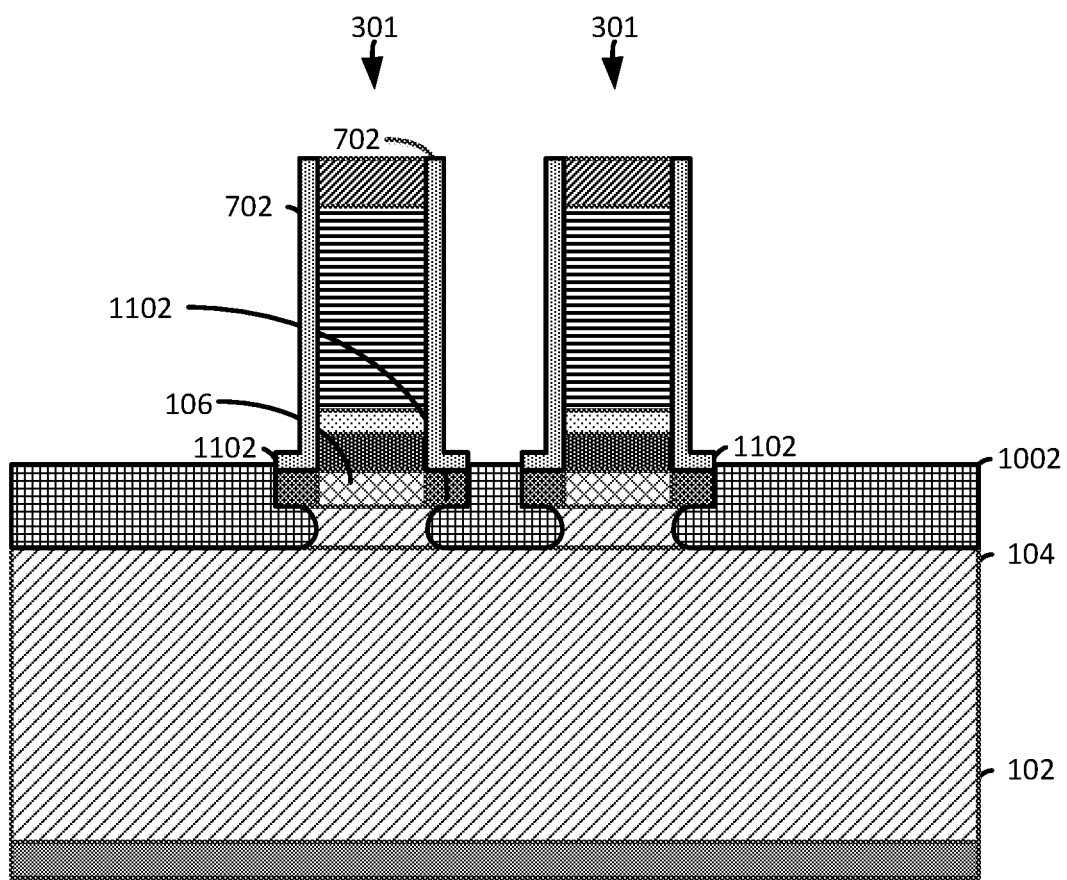
FIG. 11 illustrates a cut-away view following an annealing process that drives dopants from the source/drain regions into portions of the semiconductor layer to form doped semiconductor regions.

FIG. 11 illustrates a cut-away view following an annealing process that drives dopants from the source/drain regions 1002 into portions of the semiconductor layer 106 to form doped semiconductor regions 1102. The doped semiconductor regions 1102 define additional portions source/drain region 1002 such that collectively the doped semiconductor regions 1102 and the source/drain region 1002 form a source/drain region.

Figure 12:
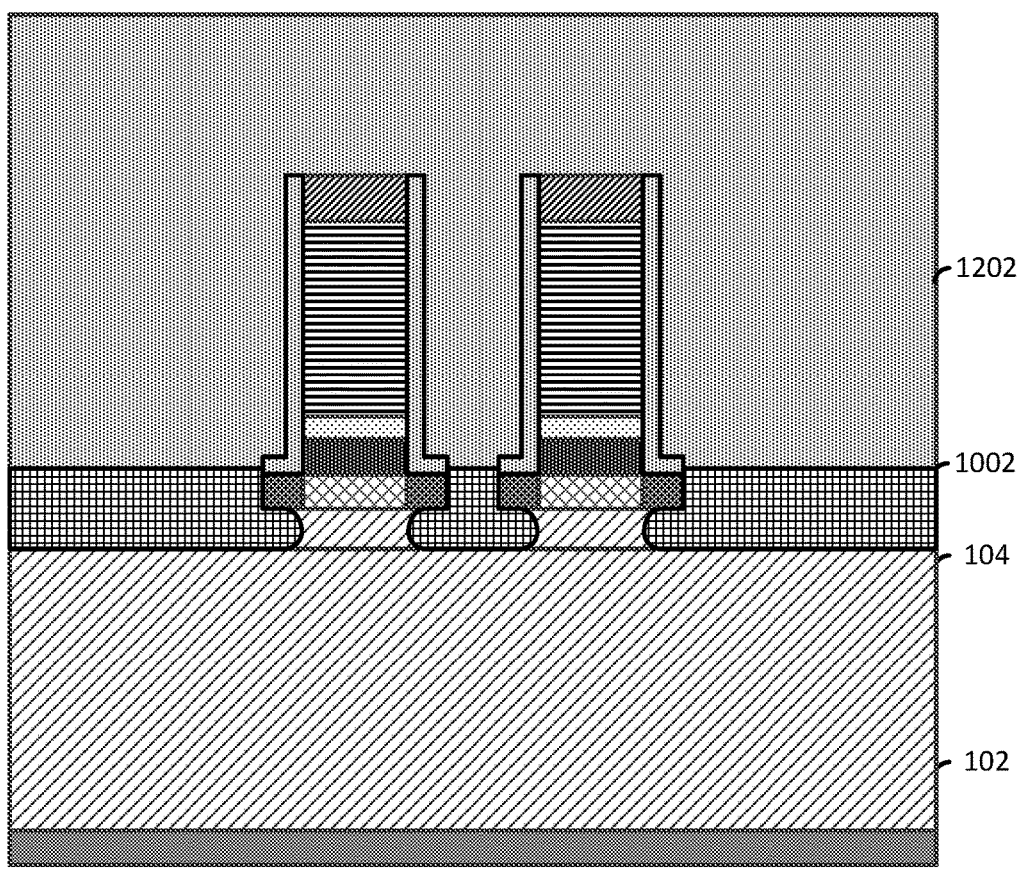
FIG. 12 illustrates a cut-away view following the formation of an inter-level dielectric layer over exposed portions of the source/drain region, the gate stacks and the second set of spacers.

FIG. 12 illustrates a cut-away view following the formation of an inter-level dielectric layer 1202 over exposed portions of the source/drain region 1002, the gate stacks 301 and the second set of spacers 702. The inter-level dielectric layer 1202 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1202 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1202, a planarization process such as, for example, chemical mechanical polishing is performed.

Figure 13:
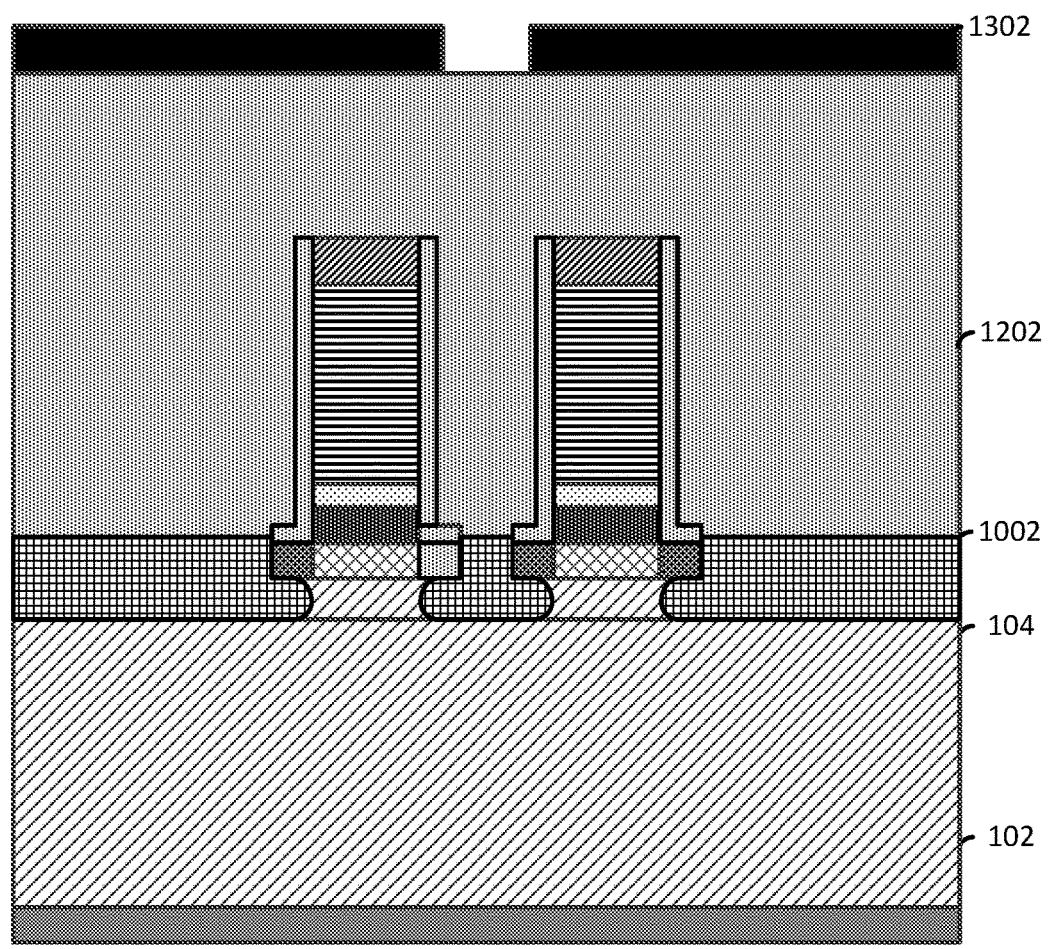
FIG. 13 illustrates a cut-away view following the patterning of a mask over exposed portions of the inter-level dielectric layer.

FIG. 13 illustrates a cut-away view following the patterning of a mask 1302 over exposed portions of the inter-level dielectric layer 1202.

Figure 14:
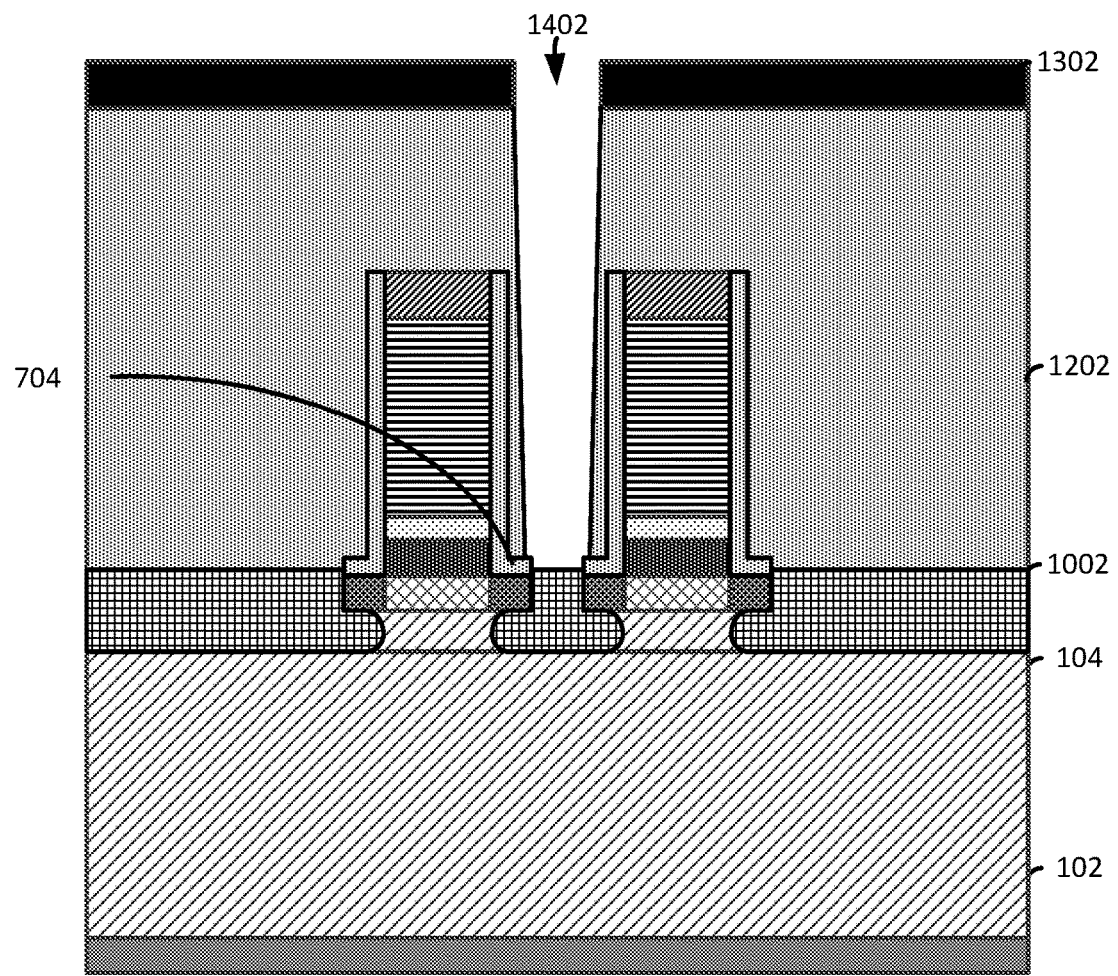
FIG. 14 illustrates a cut-away view following a selective anisotropic etching process that removes exposed portions of the inter-level dielectric layer to form a cavity.

FIG. 14 illustrates a cut-away view following a selective anisotropic etching process that removes exposed portions of the inter-level dielectric layer 1202 to form a cavity 1402. The cavity 1402 exposes a portion of the source/drain region 1002 and can expose portions of the region 704 of the second set of spacers 702. The region 704 of the second set of spacers 702 provides for an alignment of the cavity 1402 such that when the cavity 1402 is formed, the region 704 of the second set of spacers 702 remains substantially un-etched such that the source/drain region 1002 between a gap between the regions 704 is exposed. The selective etching process used to form the cavity 1402 can include, for example, reactive ion etching.

Figure 15:
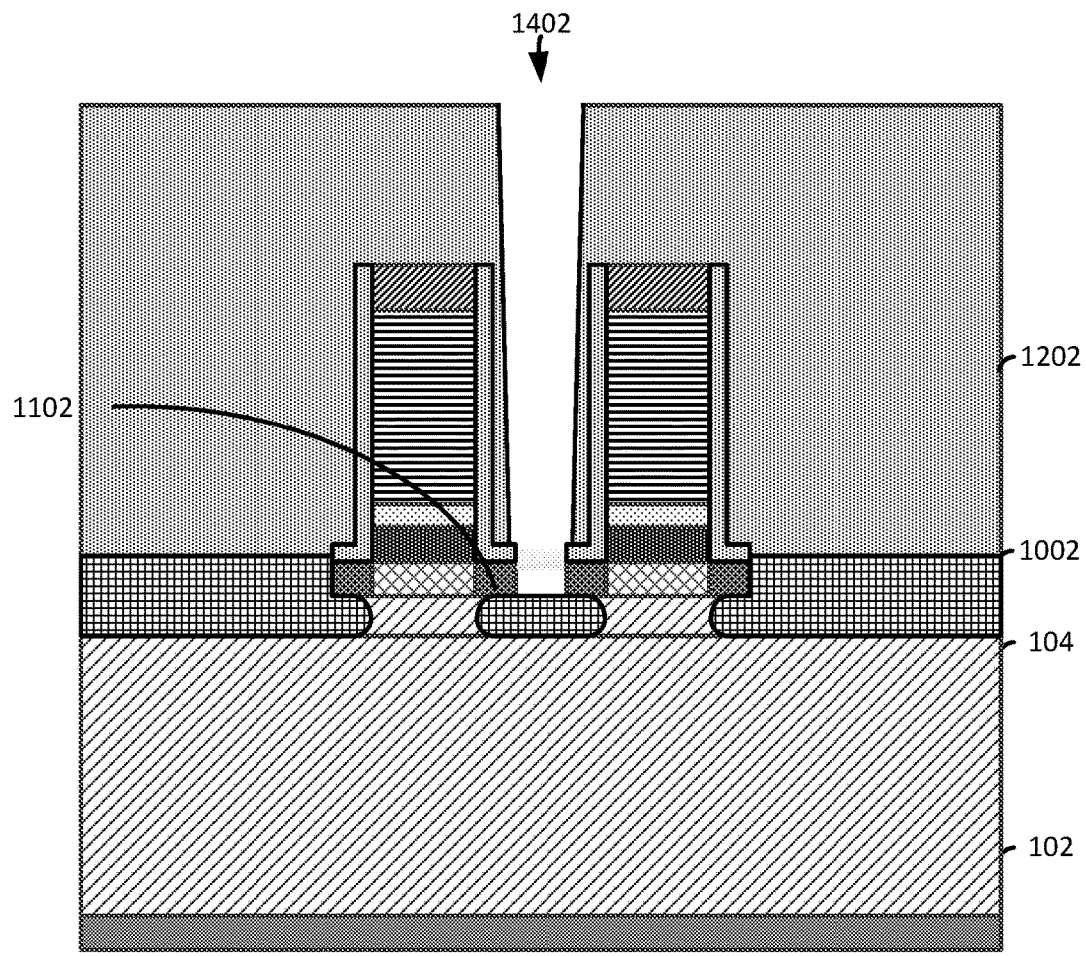
FIG. 15 illustrates a cut-away view following a selective etching process that removes exposed portions of the source/drain region in the cavity.

FIG. 15 illustrates a cut-away view following a selective etching process that removes exposed portions of the source/drain region 1002 in the cavity 1402. A selective anisotropic etching process such as, for example, reactive ion etching can be used. The removal of portions of the source/drain region 1002 exposes portions of the doped semiconductor regions 1102.

Figure 16A:
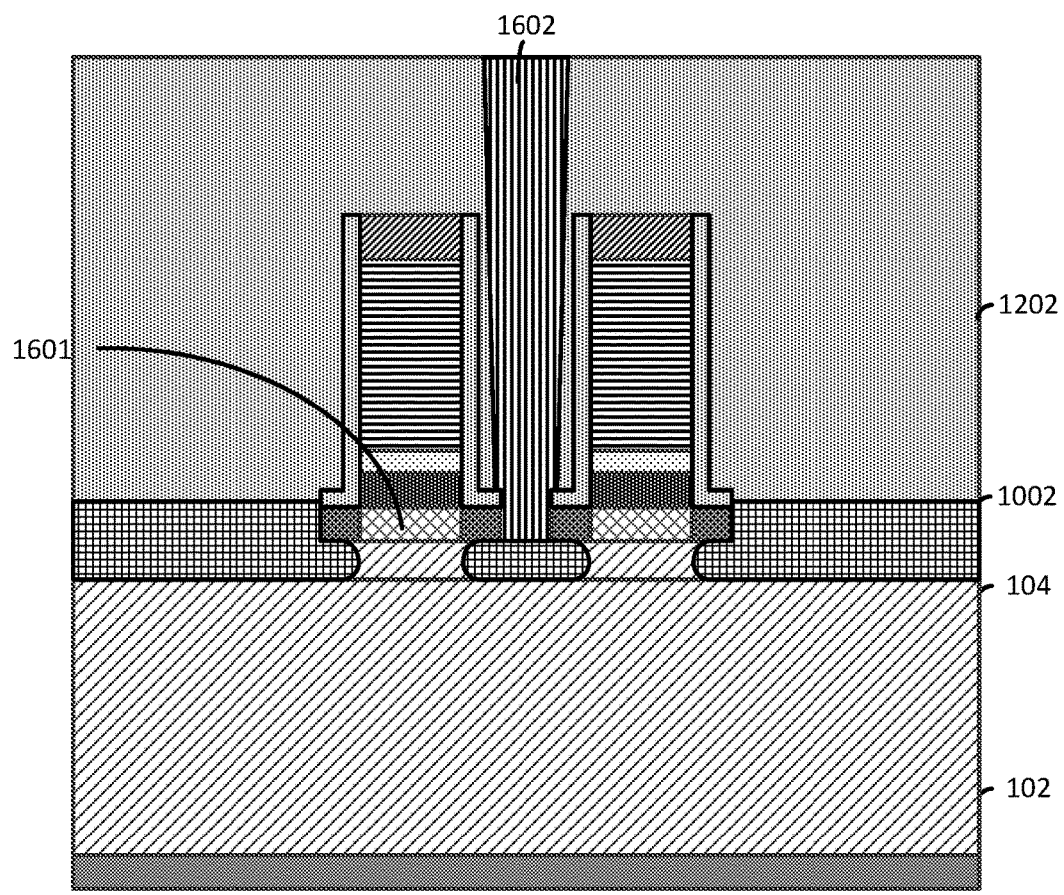
FIG. 16A illustrates a cut-away view along the line A-A (of FIG. 16B) following the formation of a conductive contact in the cavity (of FIG. 15).

FIG. 16A illustrates a cut-away view along the line A-A (of FIG. 16B) following the formation of a conductive contact 1602 in the cavity 1402 (of FIG. 15). The conductive contact 1602 can be formed by, for example, depositing a liner layer (not shown) in the cavity 1402. A conductive material is deposited in the cavity 1402. The conductive material can be planarized by, for example, chemical mechanical polishing to remove overburden material and form the conductive contact 1602. The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The conductive contact 1602 in the illustrated embodiment has a reduced parasitic capacitance since the source/drain region 1002 is partially arranged lower than the channel region 1601 of the device. The resistance in the contact is reduced as well since the removal of the portions of the source/drain region 1002 described above in FIG. 15 provides additional surface area for the interface between the conductive contact 1602 and the source/drain region 1002.

Figure 16B:
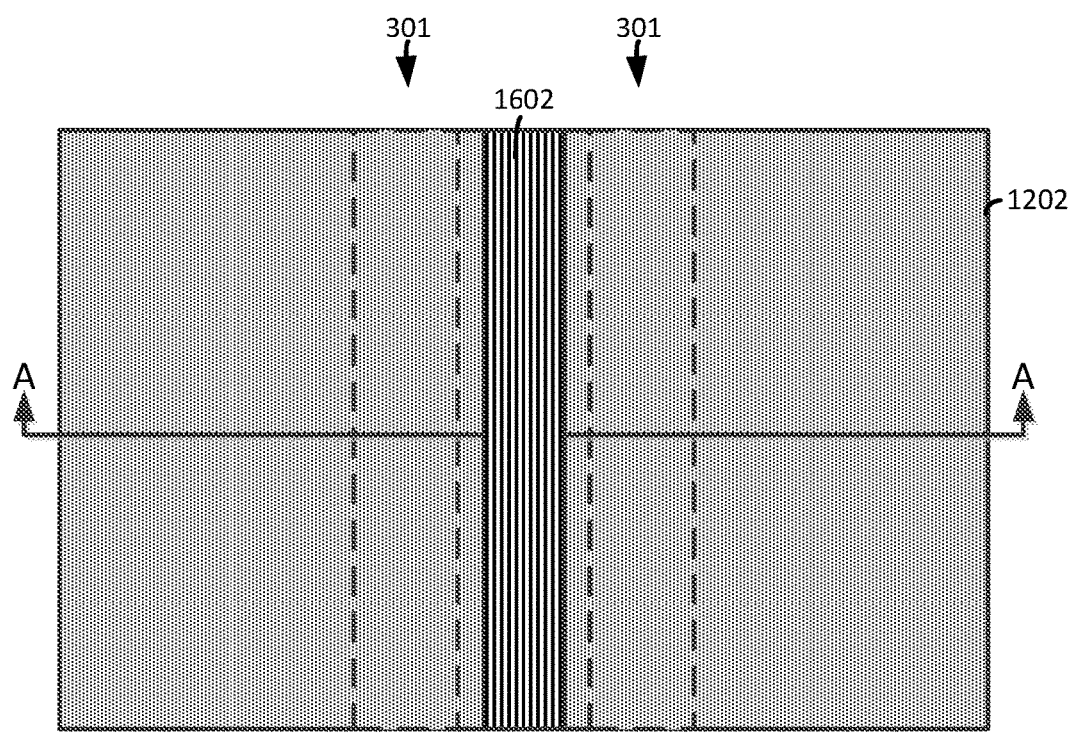
FIG. 16B illustrates a top view of the resultant structure following the formation of the conductive contact.

FIG. 16B illustrates a top view of the resultant structure following the formation of the conductive contact 1602.

Figure 17:
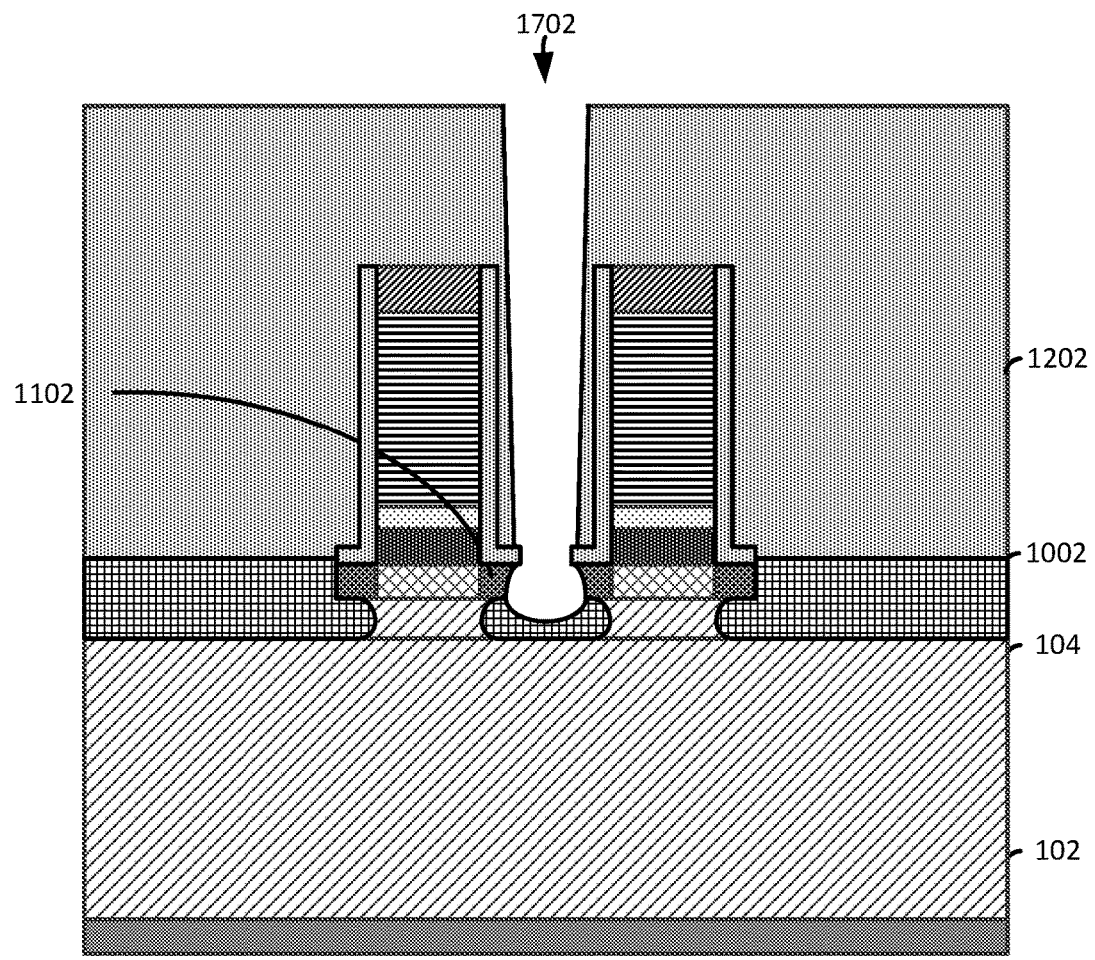
FIGS. 17-18 illustrate an alternate exemplary embodiment of a CMOS device.
Figure 18:
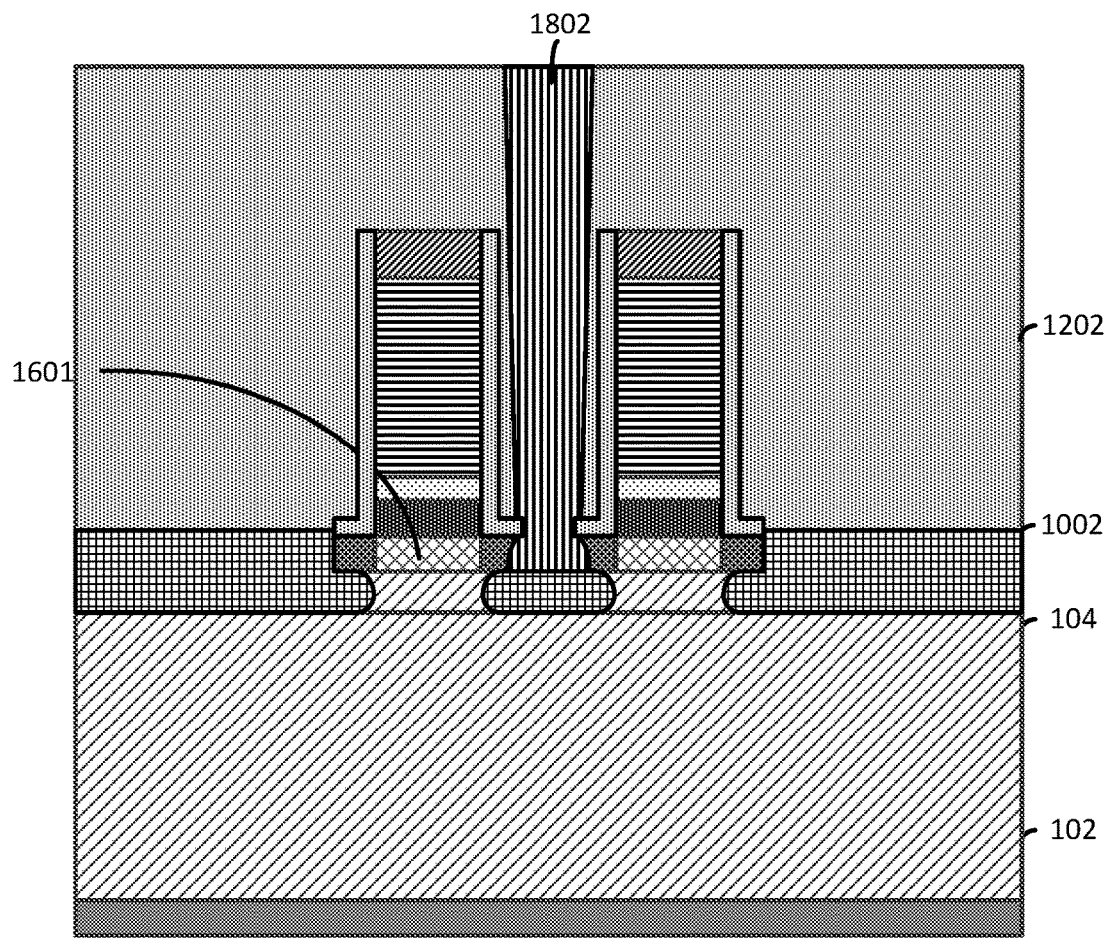

FIGS. 17-18 illustrate an alternate exemplary embodiment of a CMOS device.

FIG. 17 illustrates a cut-away view of an alternate exemplary embodiment. In this regard, following the formation of the cavity 1402 (described above in FIG. 14) a selective isotropic etching process is performed to remove exposed portions of the source/drain region 1002 and the doped semiconductor regions 1102 to form a cavity 1702. The cavity 1702 provides additional exposed surface area in the source/drain region 1002 and the doped semiconductor regions 1102 that will reduce the resistance of the conductive contacts.

FIG. 18 illustrates a cut-away view following the formation of conductive contact 1802 in the cavity 1702 (of FIG. 17). The conductive contact 1802 is similar to the conductive contact 1602 (described above), and can include a liner layer (not shown).

The conductive contact 1702 in the illustrated embodiment has a reduced parasitic capacitance since the source/drain region 1002 is partially arranged lower than the channel region 1601 of the device. The resistance in the contact is reduced as well since the removal of the portions of the source/drain region 1002 and the doped semiconductor region 1102 as described above in FIG. 17 provides additional surface area for the interface between the conductive contact 1702 and the source/drain region 1002.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a gate stack on a channel region of a semiconductor layer;
   the semiconductor layer on an insulator layer;
   a crystalline source/drain region in a first cavity in the insulator layer;
   a spacer adjacent to the gate stack, the spacer positioned on the source/drain region such that the spacer defines an L-shape and a bottommost edge of the L-shape is coplanar to a surface of the source/drain region;
   an inter-level dielectric layer over the gate stack and a portion of the source/drain region; and
   a conductive contact in a second cavity in the inter-level dielectric layer, the second cavity defined by the source/drain region and the spacer.

2. The device of claim 1, wherein the first cavity in the insulator layer is an undercut region defined by the insulator layer and the semiconductor layer.

3. The device of claim 2, wherein the semiconductor layer includes a doped semiconductor region.

4. The device of claim 3, wherein the second cavity in the inter-level dielectric layer and the source/drain region exposes a portion of the spacer.

5. The device of claim 4, wherein the second cavity in the inter-level dielectric layer and the source/drain region exposes a portion of the doped semiconductor region.

6. The device of claim 5, wherein the conductive contact includes dopants.

7. The device of claim 6, wherein the spacer includes a nitride.

8. The device of claim 6, wherein the spacer includes an oxide.

9. A semiconductor device comprising:
   a gate stack on a channel region of a semiconductor layer;
   the semiconductor layer on an insulator layer, the semiconductor layer including a doped semiconductor region;
   a crystalline source/drain region in a first cavity in the insulator layer;
   a spacer adjacent to the gate stack, the spacer being over the source/drain region;
   an inter-level dielectric layer over the gate stack and a portion of the source/drain region;
   a conductive contact in a second cavity in the inter-level dielectric layer and the source/drain region, the second cavity including an undercut region defined by the spacer, the doped semiconductor region, and the source/drain region.

10. The device of claim 9, wherein the spacer defines an L-shape.

11. The device of claim 10, wherein the first cavity is an undercut region defined by the insulator layer and the semiconductor layer.

12. The device of claim 11, wherein the conductive contact includes dopants.

13. The device of claim 12, wherein the spacer includes a nitride.

14. The device of claim 12, wherein the spacer includes an oxide.

* * * * *